US010276547B2

United States Patent
Liao

(10) Patent No.: US 10,276,547 B2
(45) Date of Patent: Apr. 30, 2019

(54) IMAGE DISPLAY MODULE AND METHOD OF MANUFACTURING THE SAME, AND DISPLAY DEVICE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

(21) Appl. No.: 15/868,972

(22) Filed: Jan. 11, 2018

(65) Prior Publication Data

US 2018/0269184 A1 Sep. 20, 2018

(30) Foreign Application Priority Data

Mar. 20, 2017 (TW) .............................. 106109178 A

(51) Int. Cl.
H01L 25/075 (2006.01)
H01L 21/66 (2006.01)
H01L 33/62 (2010.01)
H01L 33/54 (2010.01)
H01L 33/48 (2010.01)

(52) U.S. Cl.
CPC .......... *H01L 25/0753* (2013.01); *H01L 22/10* (2013.01); *H01L 33/483* (2013.01); *H01L 33/54* (2013.01); *H01L 33/62* (2013.01); *H01L 2933/005* (2013.01); *H01L 2933/0033* (2013.01); *H01L 2933/0066* (2013.01)

(58) Field of Classification Search
CPC ... H01L 25/0753; H01L 22/10; H01L 33/483; H01L 33/54; H01L 33/62
See application file for complete search history.

(56) References Cited

U.S. PATENT DOCUMENTS

2001/0022564 A1* 9/2001 Youngquist ............... G09F 9/33
345/55
2013/0207964 A1* 8/2013 Fleck ...................... H01L 33/60
345/419

FOREIGN PATENT DOCUMENTS

TW M370043 U1 12/2009
TW 201637169 A 10/2016
TW 201641996 A 12/2016

* cited by examiner

*Primary Examiner* — Cheung Lee
*Assistant Examiner* — Stephen C Smith
(74) *Attorney, Agent, or Firm* — Li & Cai Intellectual Property (USA) Office

(57) ABSTRACT

The present disclosure provides an image display module and a method of manufacturing the same, and a display device. The image display module includes a circuit substrate, a light-emitting group and a light-shading structure. The light-emitting group includes a plurality of light-emitting chips for generating a predetermined image. Each light-emitting chip has a light-emitting region, and the light-emitting region has an exposed portion and a shading portion. The light-shading structure includes a light-shading unit and a plurality of through openings passing through the light-shading unit. The exposed portion of the light-emitting region of each light-emitting chip is exposed by the through opening. The shading portion of the light-emitting region of each light-emitting chip is contacted and covered by the light-shading unit. The exposed portions of the light-emitting regions can be arranged regularly in a predetermined shape due to the through openings that are arranged in a regular arrangement.

10 Claims, 9 Drawing Sheets

IMAGE DISPLAY MODULE AND METHOD OF MANUFACTURING THE SAME, AND DISPLAY DEVICE

FIELD OF THE INVENTION

The present disclosure relates to an image display module and a method of manufacturing the same, and a display device, and more particularly to an image display module having a plurality of exposed portions arranged in a regular arrangement and a method of manufacturing the same, and a display device using the image display module.

BACKGROUND OF THE INVENTION

In recent years, LEDs (light-emitting diodes) have been used widely due to their good light-emitting quality and high light-emitting efficiency. LEDs have been developed to be capable of emitting red, green, and blue light, and have been increasingly used in various applications such as a full-color LED display, so that color performance of the full-color LED display can be increased. Typically, the red, green, and blue lights respectively generated by the red, green, and blue LEDs blend to form colored light with high brightness and contrast, so as to display information for a viewer.

SUMMARY OF THE INVENTION

One aspect of the present disclosure relates to an image display module having a plurality of exposed portions arranged in a regular arrangement and a method of manufacturing the same, and a display device using the image display module.

One of the embodiments of the present disclosure provides an image display module, including a circuit substrate, a light-emitting group and a light-shading structure. The light-emitting group includes a plurality of light-emitting chips mated with each other for generating a predetermined image. The light-emitting chips are disposed on the circuit substrate and electrically connected to the circuit substrate, each light-emitting chip has a light-emitting region on a top surface thereof, and the light-emitting region has an exposed portion and a shading portion. The light-shading structure includes a light-shading unit partially contacting and covering each light-emitting chip and a plurality of through openings passing through the light-shading unit. The exposed portion of the light-emitting region of each light-emitting chip is exposed by the corresponding one of the through openings, and the shading portion of the light-emitting region of each light-emitting chip is contacted and covered by the light-shading unit.

Another one of the embodiments of the present disclosure provides a display device using an image display module, characterized in that the image display module includes a circuit substrate, a light-emitting group and a light-shading structure. The light-emitting group includes a plurality of light-emitting chips mated with each other for generating a predetermined image, the light-emitting chips are electrically connected to the circuit substrate, and each light-emitting chip has a light-emitting region. The light-shading structure includes a light-shading unit and a plurality of through openings passing through the light-shading unit. A portion of the light-emitting region of each light-emitting chip is exposed by the corresponding one of the through openings to form an exposed portion, and the other portion of the light-emitting region of each light-emitting chip is contacted and covered by the light-shading unit to form a shading portion. The light-emitting regions are arranged irregularly in a first predetermined shape, the exposed portions of the light-emitting regions are arranged regularly in a second predetermined shape, the through openings are arranged regularly in a third predetermined shape, the first predetermined shape and the second predetermined shape are different, and the second predetermined shape and the third predetermined shape are substantially the same and correspond to each other.

Yet another one of the embodiments of the present disclosure provides a method of manufacturing an image display module, including: providing a circuit substrate; placing a light-emitting group on the circuit substrate, wherein the light-emitting group includes a plurality of light-emitting chips mated with each other for generating a predetermined image, and each light-emitting chip has a light-emitting region; and then forming a light-shading structure on the light-emitting group, wherein the light-shading structure includes a light-shading unit and a plurality of through openings passing through the light-shading unit, a portion of the light-emitting region of each light-emitting chip is exposed by the corresponding one of the through openings to form an exposed portion, and the other portion of the light-emitting region of each light-emitting chip is contacted and covered by the light-shading unit to form a shading portion. The light-emitting regions are arranged irregularly in a first predetermined shape, the exposed portions of the light-emitting regions are arranged regularly in a second predetermined shape, the through openings are arranged regularly in a third predetermined shape, the first predetermined shape and the second predetermined shape are different, and the second predetermined shape and the third predetermined shape are substantially the same and correspond to each other.

Therefore, the exposed portions of the light-emitting regions can be arranged regularly in a predetermined shape due to the through openings that are arranged in a regular arrangement, by matching the features of "a portion of the light-emitting region of each light-emitting chip being exposed by the corresponding one of the through openings to form an exposed portion, and the other portion of the light-emitting region of each light-emitting chip being contacted and covered by the light-shading unit to form a shading portion" and "the through openings being arranged regularly in a predetermined shape".

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of an image display module and a method of manufacturing the same, and a display device according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

First Embodiment

Figure 1:
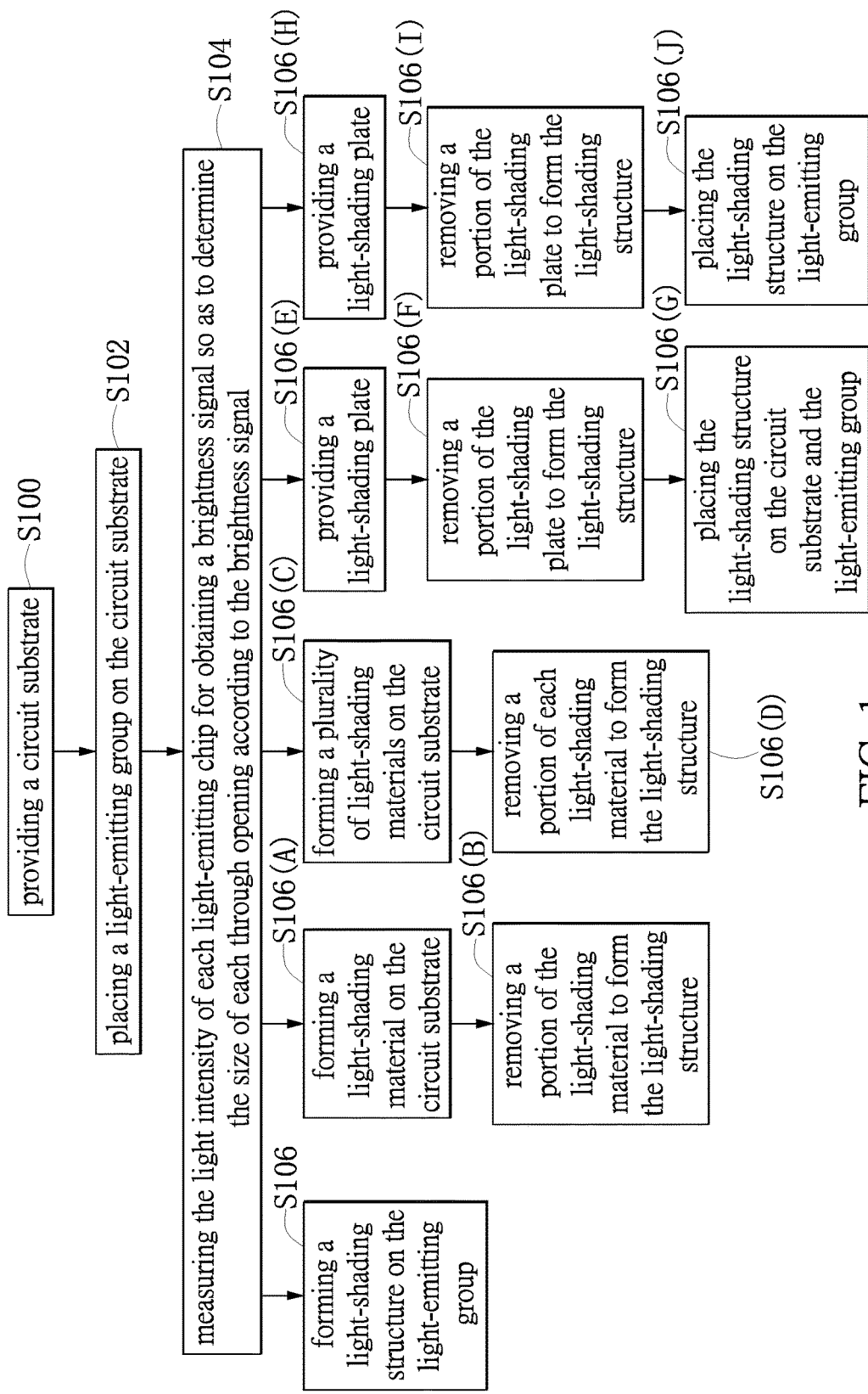
FIG. 1 shows a flowchart of a method of manufacturing an image display module according to the present disclosure.
Figure 2:
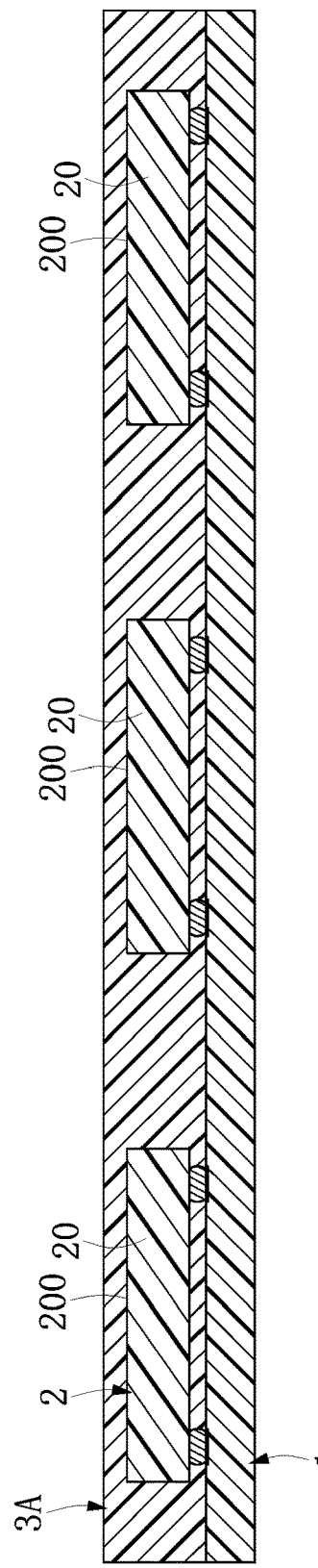
FIG. 2 shows a cross-sectional schematic view of step S100, step S102 and step S106(A) of the method of manufacturing the image display module according to a first embodiment of the present disclosure.
Figure 3:
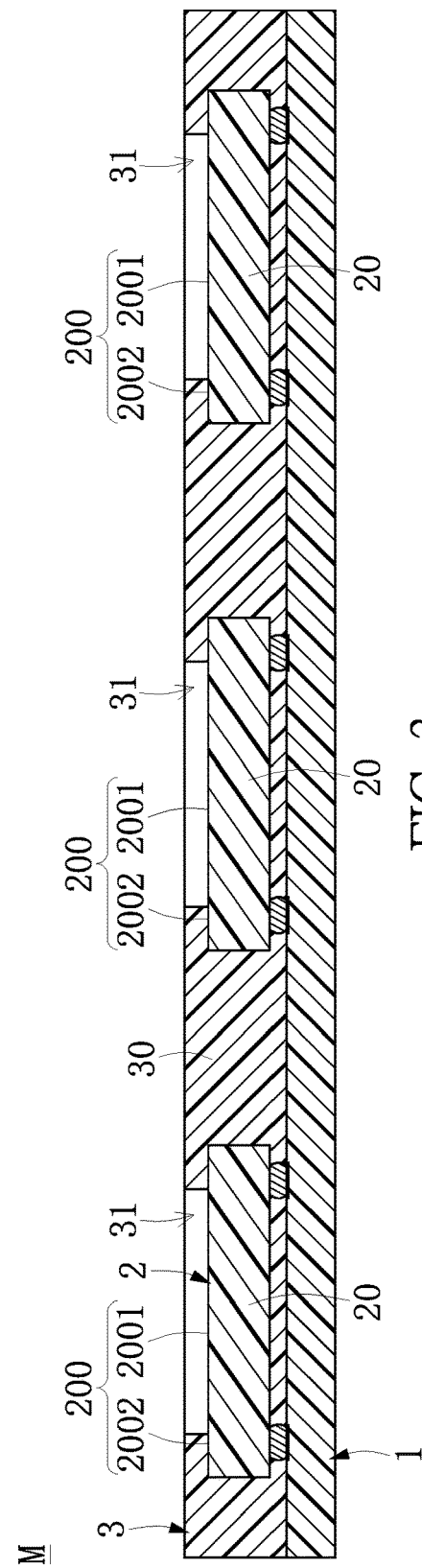
FIG. 3 shows a cross-sectional schematic view of step S106 and step S106(B) of the method of manufacturing the image display module according to the first embodiment of the present disclosure.
Figure 4:
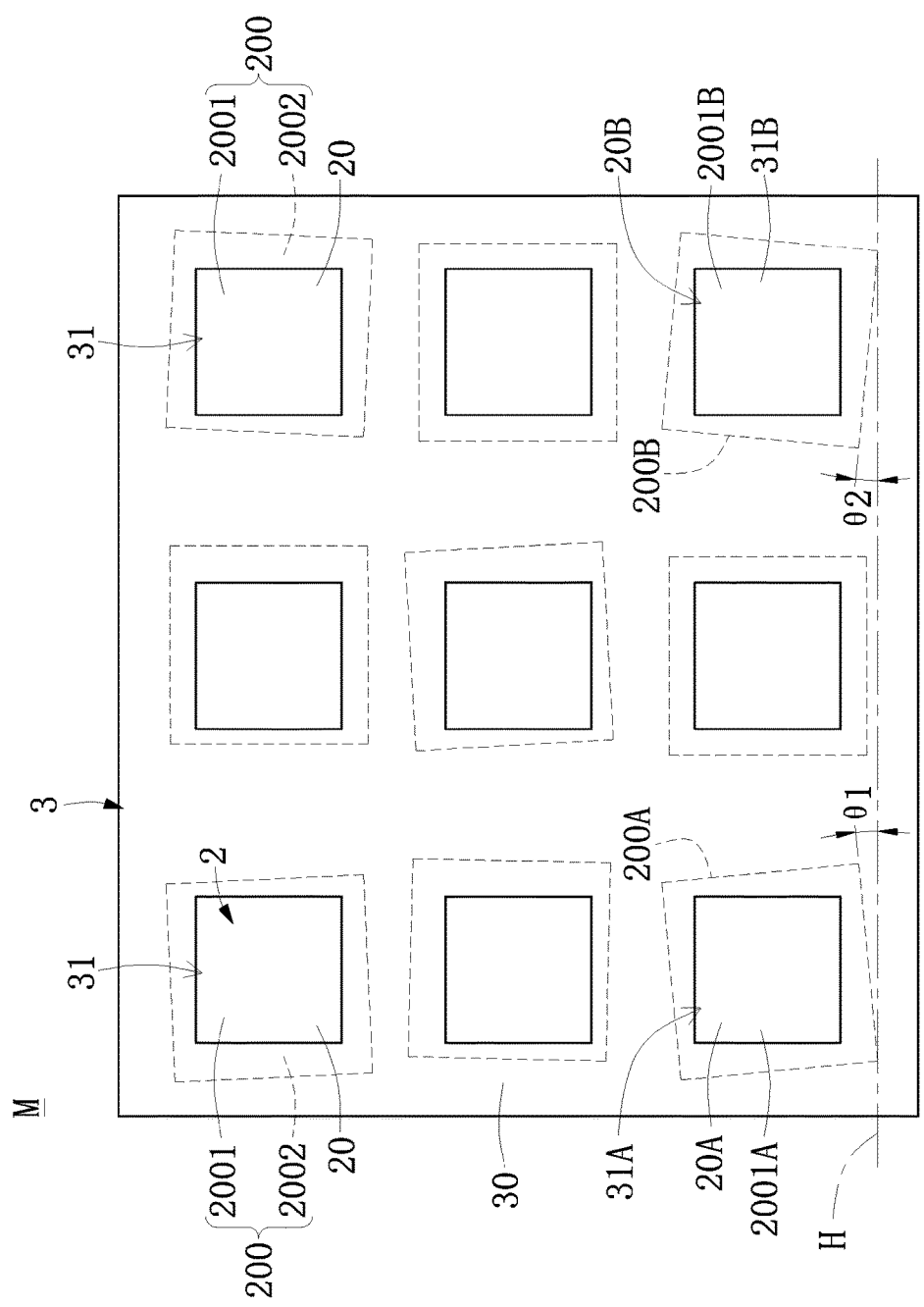
FIG. 4 shows a top schematic view of the image display module according to the first embodiment of the present disclosure.

Referring to FIG. 1 to FIG. 4, the first embodiment of the present disclosure provides a method of manufacturing an image display module M, including the following steps:

First, referring to FIG. 1 and FIG. 2, providing a circuit substrate 1 (S100), and then placing a light-emitting group 2 on the circuit substrate 1 (S102); next, referring to FIG. 1 and FIG. 3, forming a light-shading structure 3 on the light-emitting group 2 (S106) so as to finish the image display module M. More particularly, as shown in FIG. 2, the light-emitting group 2 includes a plurality of light-emitting chips 20 mated with each other for generating a predetermined image, and each light-emitting chip 20 has a light-emitting region 200. Referring to FIG. 3 and FIG. 4, the light-shading structure 3 includes a light-shading unit 30 and a plurality of through openings 31 passing through the light-shading unit 30. In addition, a portion of the light-emitting region 200 of each light-emitting chip 20 is exposed by the corresponding one of the through openings 31 to form an exposed portion 2001, and the other portion of the light-emitting region 200 of each light-emitting chip 20 is contacted and covered (or enclosed) by the light-shading unit 30 to form a shading portion 2002.

For example, the first embodiment of the present disclosure uses nine light-emitting chips 20 that are arranged in a 3×3 matrix, but it is not meant to limit the scope of the present disclosure. Each light-emitting chip 20 may be an LED chip such as a red LED for generating a red light source, a green LED for generating a green light source, a blue LED for generating a blue light source, or a white LED for generating a white light source. In addition, each light-emitting chip 20 can be electrically connected to the circuit substrate 1 through solder balls, or each light-emitting chip 20 can be electrically connected to the circuit substrate 1 through an anisotropic conductive film (ACF) or an anisotropic conductive paste (ACP), but it is not meant to limit the scope of the present disclosure.

More particularly, the step (S106) of forming the light-shading structure 3 further includes: first, referring to FIG. 1 and FIG. 2, forming a light-shading material 3A on the circuit substrate 1 to totally cover the light-emitting chips 20 of the light-emitting group 2 by coating, printing, spraying, PVD, CVD, sputtering or any other processing method (S106(A)); and then referring to FIG. 1 to FIG. 3, removing a portion of the light-shading material 3A to form the light-shading structure 3 by a photolithography process (e.g., photoresist, expose, develop, etch), a laser process, or any other processing method (S106(B)).

For example, the light-shading material 3A may be made of any opaque material, such as polyimide (PI) or any plastic material. Alternatively, the light-shading structure 3 may be a light-shading unit 30 formed by matching a light-transmitting material and an opaque layer disposed on the light-transmitting material. That is to say, when the light-emitting chips 20 are covered by the light-transmitting material, the light-emitting chips 20 can be shaded by the opaque layer that is disposed on the light-transmitting material in advance.

It should be noted that the light-emitting regions 200 can be arranged irregularly in a first predetermined shape, the exposed portions 2001 of the light-emitting regions 200 can be arranged regularly in a second predetermined shape, and the through openings 31 can be arranged regularly in a third predetermined shape, as shown in FIG. 4. In addition, the first predetermined shape and the second predetermined shape are different, and the second predetermined shape and the third predetermined shape are substantially the same and correspond to each other. More particularly, the light-emitting chips 20 are arranged irregularly on the circuit substrate 1 (such as the light-emitting chips 20 may be offset or rotated), so that the light-emitting regions 200 are arranged irregularly according to the irregular arrangement of the light-emitting chips 20. In addition, although the light-emitting regions 200 are arranged irregularly according to the irregular arrangement of the light-emitting chips 20, the exposed portions 2001 of the light-emitting regions 200 can be arranged regularly due to the regular arrangement of the through openings 31.

For example, as shown in FIG. 1, before the step (S106) of forming the light-shading structure 3, the method further includes measuring the light intensity of each light-emitting chip 20 for obtaining a brightness signal so as to determine the size of each through opening 31 according to the brightness signal (S104). That is to say, although the light intensities of the light sources respectively generated by the light-emitting chips 20 may be different, when the light intensity of each light-emitting chip 20 is measured for obtaining a brightness signal so as to determine the size of each through opening 31 according to the brightness signal, the light intensities of the light sources respectively generated by the light-emitting chips 20 would be very close or substantially the same due to the corresponding through openings 31. Therefore, the uniformity and the contrast of a predetermined image generated by the light-emitting group 2 can be increased. However, if the sizes of the through openings 31 are the same, the step S104 is not necessary. That is to say, when the sizes of the through openings 31 are the same, the exposed portions 2001 of the light-emitting regions 200 can be arranged regularly without the step S104.

In conclusion, referring to FIG. 3 and FIG. 4, due to the steps S102 to S106, the first embodiment of the present disclosure further provides an image display module M, including a circuit substrate 1, a light-emitting group 2 and a light-shading structure 3.

More particularly, the light-emitting group 2 includes a plurality of light-emitting chips 20 mated with each other for generating a predetermined image. In addition, the light-emitting chips 20 are disposed on the circuit substrate 1 and electrically connected to the circuit substrate 1. Each light-emitting chip 20 has a light-emitting region 200 on a top surface thereof, and the light-emitting region 200 has an exposed portion 2001 and a shading portion 2002.

More particularly, as shown in FIG. 3, the light-shading structure 3 includes a light-shading unit 30 partially contacting and covering each light-emitting chip 20 and a plurality of through openings 31 passing through the light-shading unit 30. In addition, the exposed portion 2001 of the light-emitting region 200 of each light-emitting chip 20 can be exposed by the corresponding one of the through openings 31, and the shading portion 2002 of the light-emitting region 200 of each light-emitting chip 20 can be contacted and covered by the light-shading unit 30. For example, the light-shading unit 30 may be a single light-shading body, and all of the through openings 31 can pass through the single light-shading body.

For example, as shown in FIG. 4, two of the light-emitting chips 20 respectively are a first light-emitting chip 20A and a second light-emitting chip 20B, and the light intensity of the first light-emitting chip 20A is greater than the light intensity of the second light-emitting chip 20B. In addition, two of the through openings 31 respectively are a first through opening 31A and a second through opening 31B, and the area of the first through opening 31A is smaller than the area of the second through opening 31B. Moreover, a first exposed portion 2001A of a first light-emitting region 200A of the first light-emitting chip 20A is exposed by the first through opening 31A, a second exposed portion 2001B of a second light-emitting region 200B of the second light-emitting chip 20B is exposed by the second through opening 31B, and the area of the first exposed portion 2001A of the first light-emitting region 200A is smaller than the area of the second exposed portion 2001B of the second light-emitting region 200B.

As described above, although the light intensity of the first light-emitting chip 20A is greater than the light intensity of the second light-emitting chip 20B, when the area of the first through opening 31A is smaller than the area of the second through opening 31B, the area of the first exposed portion 2001A of the first light-emitting region 200A would be smaller than the area of the second exposed portion 2001B of the second light-emitting region 200B. Hence, in this embodiment, the light intensity of the image source generated from the first exposed portion 2001A of the first light-emitting region 200A of the first light-emitting chip 20A and the light intensity of the image source generated from the second exposed portion 2001B of the second light-emitting region 200B of the first light-emitting chip 20A are very close or substantially the same, so that the uniformity and the contrast of a predetermined image generated by the light-emitting group 2 can be increased.

For example, as shown in FIG. 4, two of the light-emitting chips 20 respectively are a first light-emitting chip 20A and a second light-emitting chip 20B, and the first light-emitting chip 20A and the second light-emitting chip 20B are respectively disposed at a first predetermined angle θ1 and a second predetermined angle θ2 relative to a horizontal line H. In addition, two of the through openings 31 respectively are a first through opening 31A and a second through opening 31B, and both the first through opening 31A (such as a top side or a bottom side of the first through opening 31A) and the second through opening 31B (such as a top side or a bottom side of the second through opening 31B) are horizontal to the horizontal line H. Moreover, a first exposed portion 2001A of a first light-emitting region 200A of the first light-emitting chip 20A is exposed by the first through opening 31A, a second exposed portion 2001B of a second light-emitting region 200B of the second light-emitting chip 20B is exposed by the second through opening 31B, and both the first exposed portion 2001A and the second exposed portion 2001B are horizontal to the horizontal line H.

As described above, although the first light-emitting chip 20A and the second light-emitting chip 20B are respectively disposed at a first predetermined angle θ1 and a second predetermined angle θ2 relative to a horizontal line H, when both the first through opening 31A and the second through opening 31B are horizontal to the horizontal line H, the first exposed portion 2001A that is exposed by the first through opening 31A and the second exposed portion 2001B that is exposed by the second through opening 31B are horizontal to the horizontal line H. That is to say, when the light-emitting chips 20 are disposed irregularly on the circuit substrate 1 due to offset or rotation errors in positioning of the light-emitting chips 20, the first light-emitting regions 200A and the second light-emitting regions 200B would be arranged irregularly due to the irregular arrangement of the light-emitting chips 20. However, the first through openings 31A and the second through openings 31B are disposed regularly, and the first exposed portions 2001A are respectively exposed by the first through openings 31A and the second exposed portion 2001B are respectively exposed by the second through openings 31B, so that the first exposed portions 2001A and the second exposed portion 2001B would be arranged irregularly.

Second Embodiment

Figure 5:
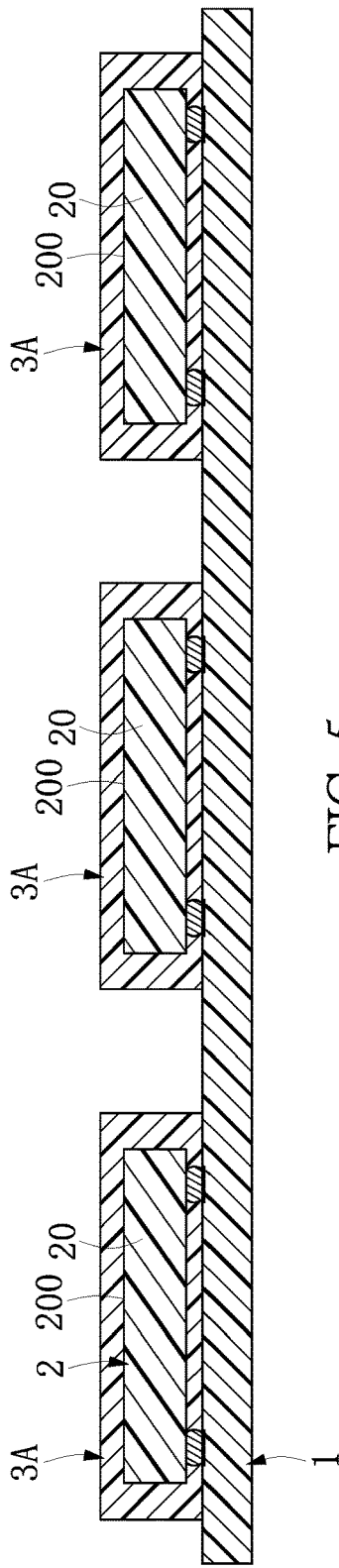
FIG. 5 shows a cross-sectional schematic view of step S106(C) of the method of manufacturing the image display module according to a second embodiment of the present disclosure.
Figure 6:
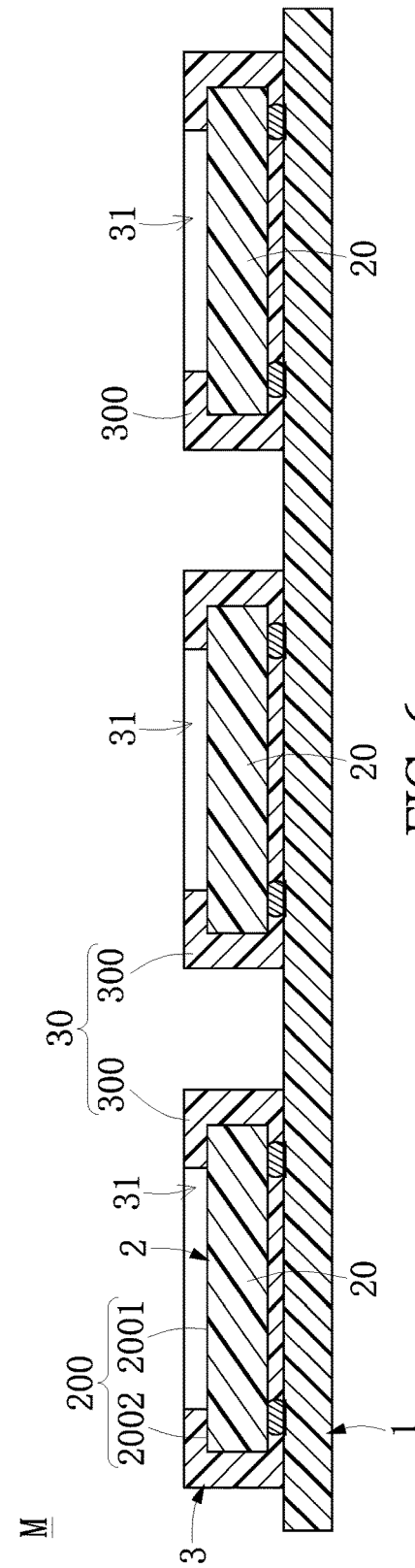
FIG. 6 shows a cross-sectional schematic view of step S106(D) of the method of manufacturing the image display module according to the second embodiment of the present disclosure.

Referring to FIG. 5 and FIG. 6, the second embodiment of the present disclosure provides a method of manufacturing an image display module M. Comparing FIG. 5 with FIG. 2, and FIG. 6 with FIG. 3, the difference between the second embodiment and the first embodiment is as follows: in the second embodiment, the step (S106) of forming the light-shading structure 3 further includes: first, referring to FIG. 1 and FIG. 5, forming a plurality of light-shading materials 3A on the circuit substrate 1 to respectively totally cover the light-emitting chips 20 of the light-emitting group 2 by coating, printing, spraying, PVD, CVD, sputtering or any other processing method (S106(C)); and then referring to FIG. 1 to FIG. 6, removing a portion of each light-shading material 3A to form the light-shading structure 3 by a photolithography process (e.g., photoresist, expose, develop, etch), a laser process, or any other processing method (S106(D)).

For example, the light-shading unit 30 includes a plurality of light-shading bodies 300 separated from each other, and the through openings 31 can respectively pass through the light-shading bodies 300.

Third Embodiment

Figure 7:
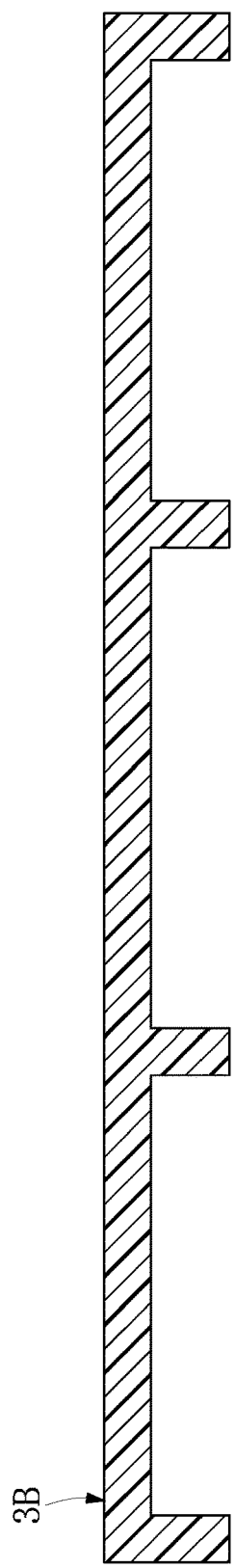
FIG. 7 shows a cross-sectional schematic view of step S106(E) of the method of manufacturing the image display module according to a third embodiment of the present disclosure.
Figure 8:
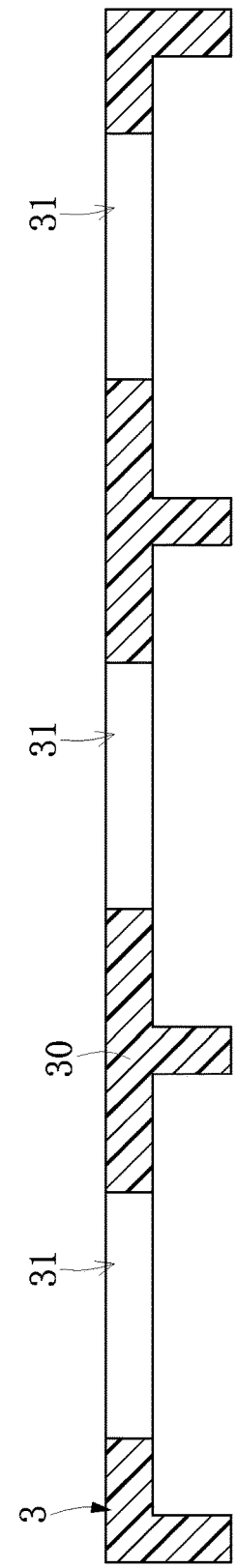
FIG. 8 shows a cross-sectional schematic view of step S106(F) of the method of manufacturing the image display module according to the third embodiment of the present disclosure.
Figure 9:
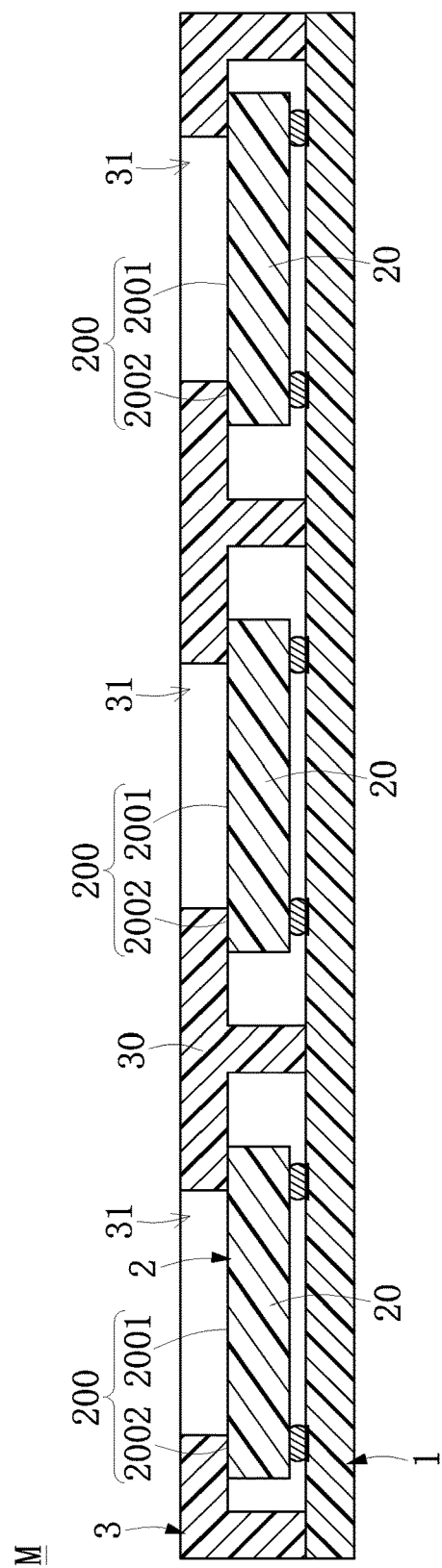
FIG. 9 shows a cross-sectional schematic view of step S106(G) of the method of manufacturing the image display module according to the third embodiment of the present disclosure.

Referring to FIG. 7 to FIG. 9, the third embodiment of the present disclosure provides a method of manufacturing an image display module M. The difference between the third embodiment and the first embodiment is as follows: in the third embodiment, the step (S106) of forming the light-shading structure 3 further includes: first, referring to FIG. 1 and FIG. 7, providing a light-shading plate 3B (S106(E)); next, referring to FIG. 1, FIG. 7 and FIG. 8, removing a portion of the light-shading plate 3B to form the light-shading structure 3 by a photolithography process (e.g., photoresist, expose, develop, etch), a laser process, or any other processing method (S106(F)); and then, referring to FIG. 1, FIG. 8 and FIG. 9, placing the light-shading structure 3 on the circuit substrate 1 and the light-emitting group 2 to contact the shading portion 2002 of the light-emitting region 200 of each light-emitting chip 20 (S106(G)) so as to finish the image display module M. It should be noted that the light-shading structure 3 can be in contact with the circuit substrate 1.

Fourth Embodiment

Figure 10:
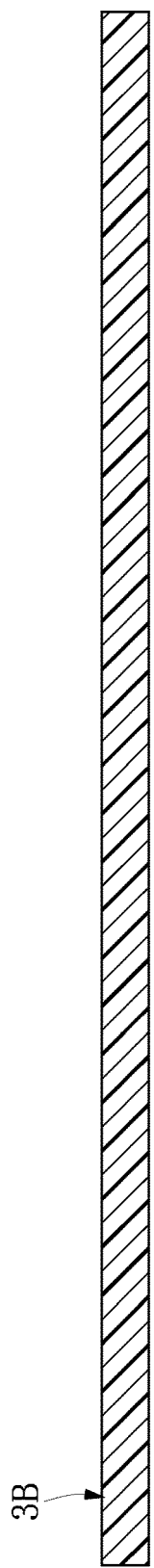
FIG. 10 shows a cross-sectional schematic view of step S106(H) of the method of manufacturing the image display module according to a fourth embodiment of the present disclosure.
Figure 11:
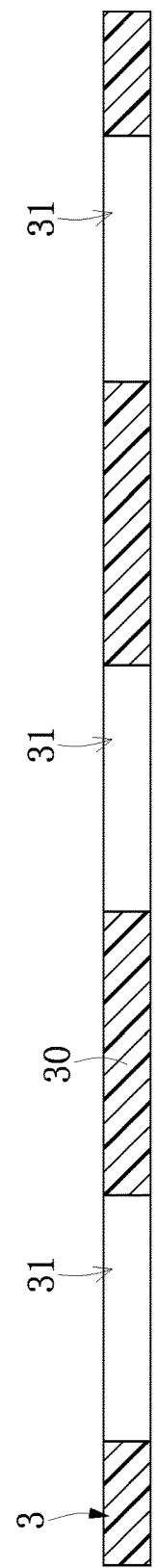
FIG. 11 shows a cross-sectional schematic view of step S106(I) of the method of manufacturing the image display module according to the fourth embodiment of the present disclosure.
Figure 12:
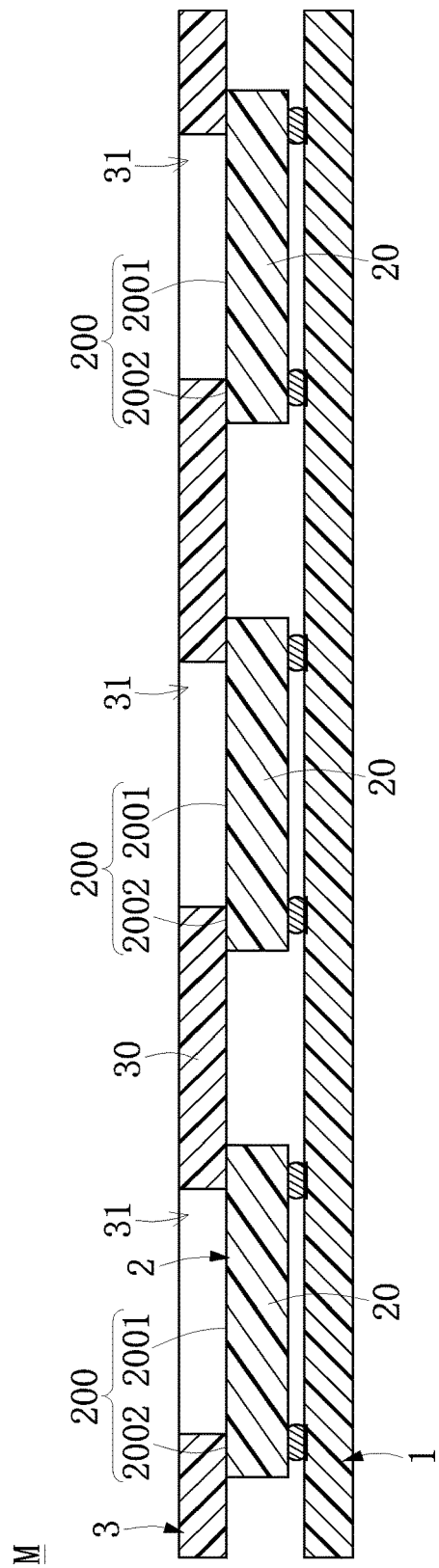
FIG. 12 shows a cross-sectional schematic view of step S106(J) of the method of manufacturing the image display module according to the fourth embodiment of the present disclosure.

Referring to FIG. 10 to FIG. 12, the fourth embodiment of the present disclosure provides a method of manufacturing an image display module M. The difference between the fourth embodiment and the first embodiment is as follows: in the fourth embodiment, the step (S106) of forming the light-shading structure 3 further includes: first, referring to FIG. 1 and FIG. 10, providing a light-shading plate 3B (S106(H)); next, referring to FIG. 1, FIG. 10 and FIG. 11, removing a portion of the light-shading plate 3B to form the light-shading structure 3 by a photolithography process (e.g., photoresist, expose, develop, etch), a laser process, or any other processing method (S106(I)); and then, referring to FIG. 1, FIG. 11 and FIG. 12, placing the light-shading structure 3 on the light-emitting group 2 to contact the shading portion 2002 of the light-emitting region 200 of each light-emitting chip 20 (S106(J)) so as to finish the image display module M. It should be noted that the light-shading structure 3 and the circuit substrate 1 are separated from each other.

Fifth Embodiment

Figure 13:
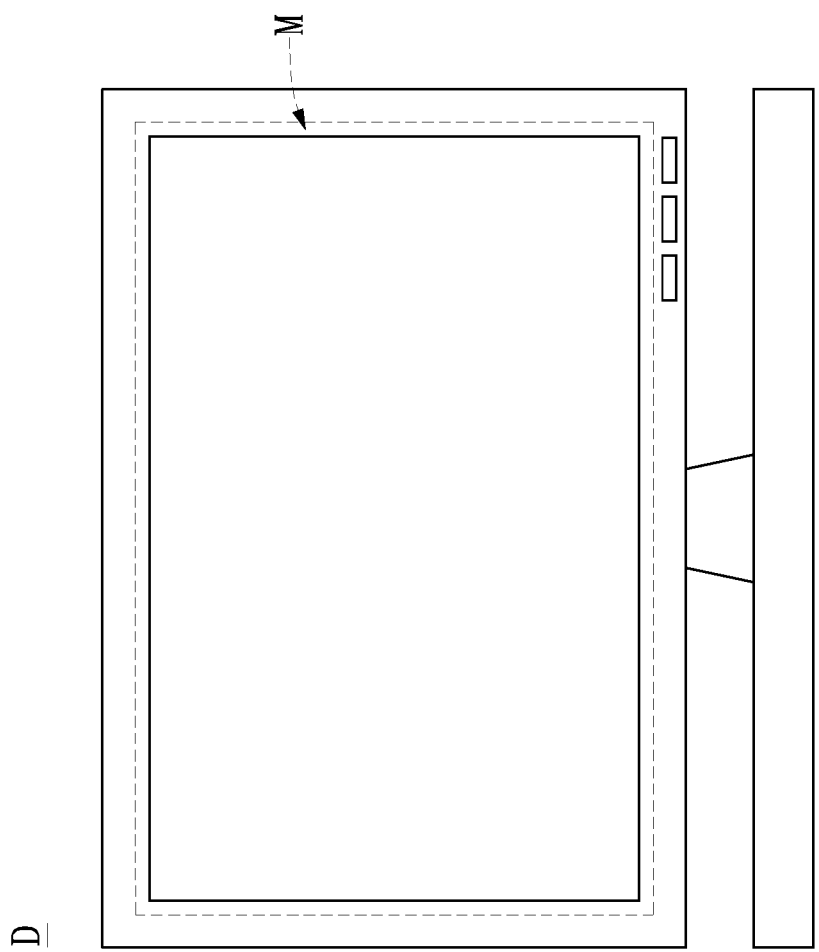
FIG. 13 shows a schematic view of a display device according to a fifth embodiment of the present disclosure.

Referring to FIG. 13, the fifth embodiment of the present disclosure provides a display device D using an image display module M. For example, the image display module M of any one of the first to the fourth embodiments can be used by display device D.

In conclusion, the exposed portions 2001 of the light-emitting regions 200 can be arranged regularly in a predetermined shape due to the through openings 31 that are arranged in a regular arrangement, by matching the features of "a portion of the light-emitting region 200 of each light-emitting chip 20 being exposed by the corresponding one of the through openings 31 to form an exposed portion 2001, and the other portion of the light-emitting region 200 of each light-emitting chip 20 being contacted and covered by the light-shading unit 30 to form a shading portion 2002" and "the through openings 31 being arranged regularly in a predetermined shape".

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. An image display module, comprising:
   a circuit substrate;
   a light-emitting group including a plurality of light-emitting chips mated with each other for generating a predetermined image, wherein the light-emitting chips are disposed on the circuit substrate and electrically connected to the circuit substrate, each light-emitting chip has a light-emitting region on a top surface thereof, and the light-emitting region has an exposed portion and a shading portion; and
   a light-shading structure including a light-shading unit partially contacting and covering each light-emitting chip and a plurality of through openings passing through the light-shading unit, wherein the exposed portion of the light-emitting region of each light-emitting chip is exposed by the corresponding one of the through openings, and the shading portion of the light-emitting region of each light-emitting chip is directly contacted and covered by the light-shading unit to shade light emitted by the shading portion.

2. The image display module of claim 1, wherein the light-emitting regions are arranged irregularly in a first predetermined shape, the exposed portions of the light-emitting regions are arranged regularly in a second predetermined shape, the through openings are arranged regularly in a third predetermined shape, the first predetermined shape and the second predetermined shape are different, and the second predetermined shape and the third predetermined shape are substantially the same and correspond to each other.

3. The image display module of claim 1, wherein two of the light-emitting chips respectively are a first light-emitting chip and a second light-emitting chip, and the light intensity of the first light-emitting chip is greater than the light intensity of the second light-emitting chip, wherein two of the through openings respectively are a first through opening and a second through opening, and the area of the first through opening is smaller than the area of the second through opening, wherein a first exposed portion of a first light-emitting region of the first light-emitting chip is exposed by the first through opening, a second exposed portion of a second light-emitting region of the second light-emitting chip is exposed by the second through opening, and the area of the first exposed portion of the first light-emitting region is smaller than the area of the second exposed portion of the second light-emitting region, and wherein the light-shading unit is a single light-shading body, and all of the through openings pass through the single light-shading body.

4. The image display module of claim 1, wherein two of the light-emitting chips respectively are a first light-emitting chip and a second light-emitting chip, and the first light-emitting chip and the second light-emitting chip are respectively disposed at a first predetermined angle and a second predetermined angle relative to a horizontal line, wherein two of the through openings respectively are a first through opening and a second through opening, and both the first through opening and the second through opening are horizontal to the horizontal line, wherein a first exposed portion of a first light-emitting region of the first light-emitting chip is exposed by the first through opening, a second exposed portion of a second light-emitting region of the second light-emitting chip is exposed by the second through opening, and both the first exposed portion and the second exposed portion are horizontal to the horizontal line, and wherein the light-shading unit includes a plurality of light-shading bodies separated from each other, and the through openings respectively pass through the light-shading bodies.

5. A display device using an image display module, characterized in that the image display module comprises:
   a circuit substrate;
   a light-emitting group including a plurality of light-emitting chips mated with each other for generating a predetermined image, wherein the light-emitting chips are electrically connected to the circuit substrate, and each light-emitting chip has a light-emitting region; and
   a light-shading structure including a light-shading unit and a plurality of through openings passing through the light-shading unit, wherein a portion of the light-emitting region of each light-emitting chip is exposed by the corresponding one of the through openings to form an exposed portion, and the other portion of the light-emitting region of each light-emitting chip is contacted and covered by the light-shading unit to form a shading portion;
   wherein the light-emitting regions are arranged irregularly in a first predetermined shape, the exposed portions of the light-emitting regions are arranged regularly in a second predetermined shape, the through openings are arranged regularly in a third predetermined shape, the first predetermined shape and the second predetermined shape are different, and the second predetermined shape and the third predetermined shape are substantially the same and correspond to each other.

6. A method of manufacturing an image display module, comprising:
   providing a circuit substrate;
   placing a light-emitting group on the circuit substrate, wherein the light-emitting group includes a plurality of light-emitting chips mated with each other for generating a predetermined image, and each light-emitting chip has a light-emitting region; and
   forming a light-shading structure on the light-emitting group, wherein the light-shading structure includes a light-shading unit and a plurality of through openings passing through the light-shading unit, a portion of the light-emitting region of each light-emitting chip is exposed by the corresponding one of the through openings to form an exposed portion, and the other portion of the light-emitting region of each light-emitting chip is contacted and covered by the light-shading unit to form a shading portion;
   wherein the light-emitting regions are arranged irregularly in a first predetermined shape, the exposed portions of the light-emitting regions are arranged regularly in a second predetermined shape, the through openings are arranged regularly in a third predetermined shape, the first predetermined shape and the second predetermined shape are different, and the second predetermined shape and the third predetermined shape are substantially the same and correspond to each other.

7. The method of claim 6, wherein before the step of forming the light-shading structure, the method further comprises: measuring the light intensity of each light-emitting chip for obtaining a brightness signal so as to determine the size of each through opening according to the brightness signal.

8. The method of claim 6, wherein the step of forming the light-shading structure further comprises:
   forming a light-shading material on the circuit substrate to totally cover the light-emitting group; and
   removing a portion of the light-shading material to form the light-shading structure.

9. The method of claim 6, wherein the step of forming the light-shading structure further comprises:
   providing a light-shading plate;
   removing a portion of the light-shading plate to form the light-shading structure; and
   placing the light-shading structure on the circuit substrate and the light-emitting group to contact the shading portion of the light-emitting region of each light-emitting chip.

10. The method of claim 6, wherein the step of forming the light-shading structure further comprises:
   providing a light-shading plate;
   removing a portion of the light-shading plate to form the light-shading structure; and
   placing the light-shading structure on the light-emitting group to contact the shading portion of the light-emitting region of each light-emitting chip, wherein the light-shading structure and the circuit substrate are separated from each other.

* * * * *